United States Patent
Kutsaev et al.

(10) Patent No.: US 12,022,747 B2
(45) Date of Patent: Jun. 25, 2024

(54) QUANTUM COMPUTING STRUCTURES AND RESONATORS THEREOF

(71) Applicant: RadiaBeam Technologies, LLC, Santa Monica, CA (US)

(72) Inventors: Sergey Kutsaev, Santa Monica, CA (US); Ronald Agustsson, Venice, CA (US); Kirill Taletski, Santa Monica, CA (US)

(73) Assignee: RadiaBeam Technologies, LLC, Santa Monica, CA (US)

( * ) Notice: Subject to any disclaimer, the term of this patent is extended or adjusted under 35 U.S.C. 154(b) by 422 days.

(21) Appl. No.: 17/605,915

(22) PCT Filed: Apr. 22, 2020

(86) PCT No.: PCT/US2020/029364
§ 371 (c)(1),
(2) Date: Oct. 22, 2021

(87) PCT Pub. No.: WO2020/219578
PCT Pub. Date: Oct. 29, 2020

(65) Prior Publication Data
US 2022/0223778 A1 Jul. 14, 2022

Related U.S. Application Data

(60) Provisional application No. 62/837,655, filed on Apr. 23, 2019.

(51) Int. Cl.
*H10N 60/80* (2023.01)
*G06N 10/40* (2022.01)
*H10N 60/12* (2023.01)

(52) U.S. Cl.
CPC ........... *H10N 60/805* (2023.02); *G06N 10/40* (2022.01); *H10N 60/12* (2023.02)

(58) Field of Classification Search
CPC ...... H10N 60/12; H10N 60/805; H10N 60/81; H01P 7/06; G06N 10/40; G06N 10/00
See application file for complete search history.

(56) References Cited

U.S. PATENT DOCUMENTS

| | | | |
|---|---|---|---|
| 9,796,586 B2 * | 10/2017 | Najafi | ................... B22D 25/02 |
| 10,263,170 B1 | 4/2019 | Brink et al. | |

(Continued)

FOREIGN PATENT DOCUMENTS

| | | |
|---|---|---|
| WO | WO 2013/126120 | 8/2013 |
| WO | WO 2016/138395 | 1/2016 |

OTHER PUBLICATIONS

International Search Report and Written Opinion—PCT/US2020/029364 filed Apr. 22, 2020, dated Jun. 30, 2020, 6 pages.

*Primary Examiner* — Quan Tra
(74) *Attorney, Agent, or Firm* — Knobbe, Martens, Olson & Bear, LLP

(57) ABSTRACT

Embodiments disclosed herein include a resonator for use in quantum computing. The resonator can include a housing that is disposed along a resonator axis. The housing can have a first portion extending from a housing distal end to near a qubit location and a second portion extending from near the qubit location to a housing proximal end. The housing can define a cavity extending from a cavity proximal end to a cavity distal end along a portion of the resonator axis. The housing can include a protrusion extending axially from the housing distal end along the resonator axis to near the qubit location. A proximal portion of the protrusion can include a tapered portion. The resonator can include a qubit extending into the cavity at the qubit location.

20 Claims, 11 Drawing Sheets

(56) References Cited

U.S. PATENT DOCUMENTS

| | | | |
|---|---|---|---|
| 11,703,331 B2 * | 7/2023 | Najafi | G01C 19/5684 |
| | | | 73/504.12 |
| 11,791,532 B1 * | 10/2023 | Moore | H01P 5/107 |
| | | | 333/232 |
| 2012/0319085 A1 | 12/2012 | Gambetta et al. | |
| 2020/0309527 A1 * | 10/2020 | Shkel | G01C 19/5719 |

* cited by examiner

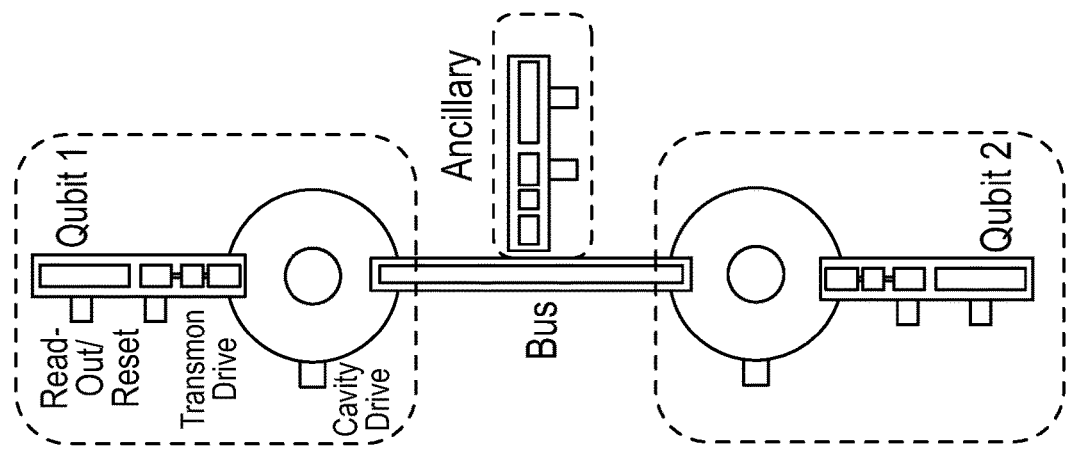
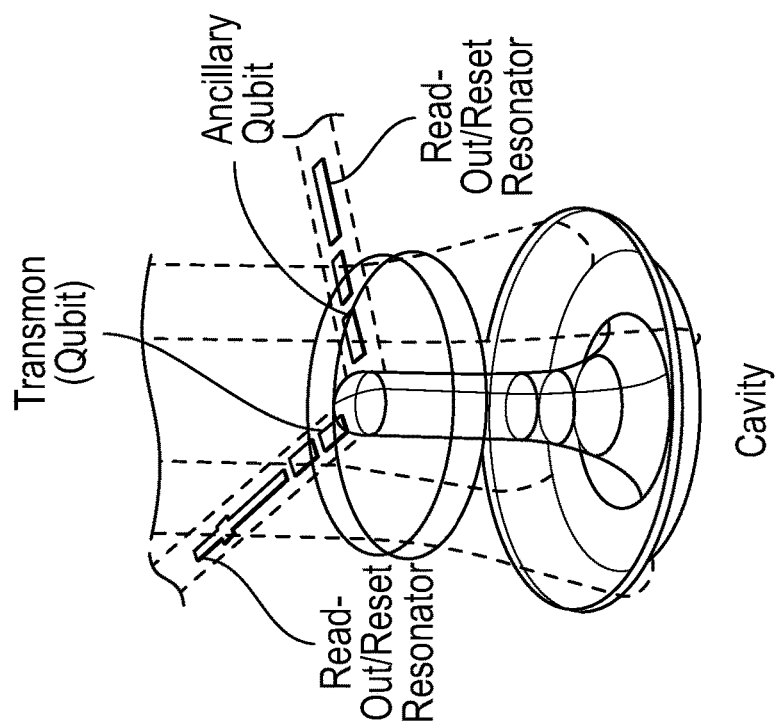
FIG. 5

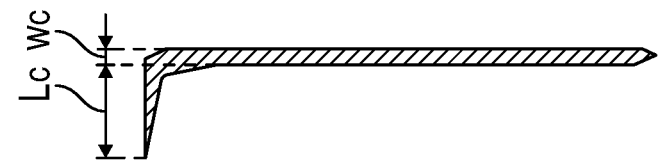
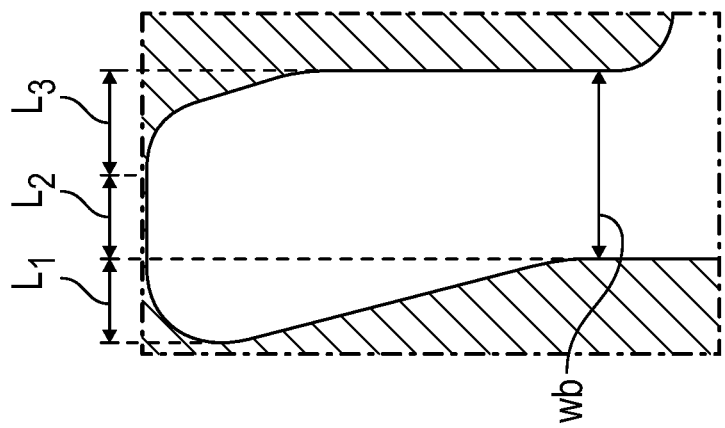
FIG. 8b
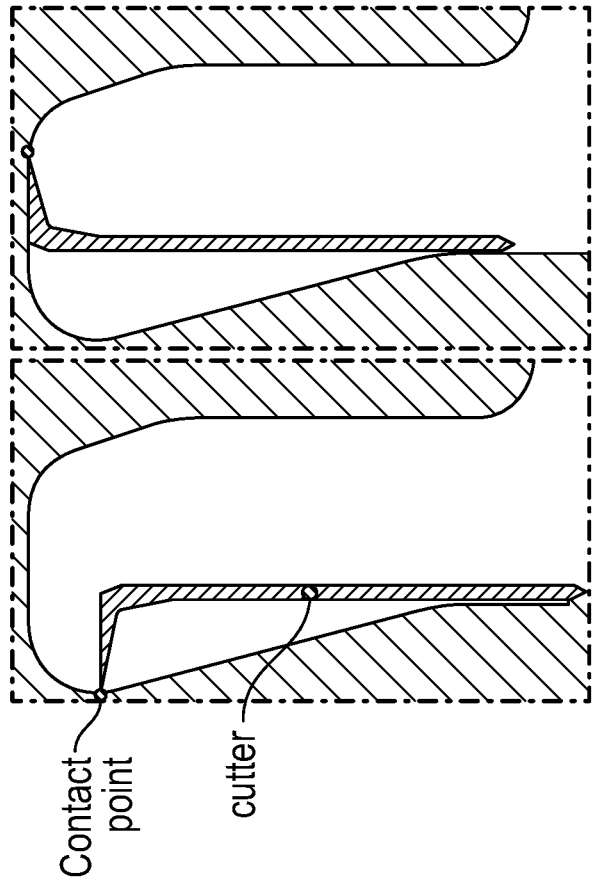
FIG. 8a

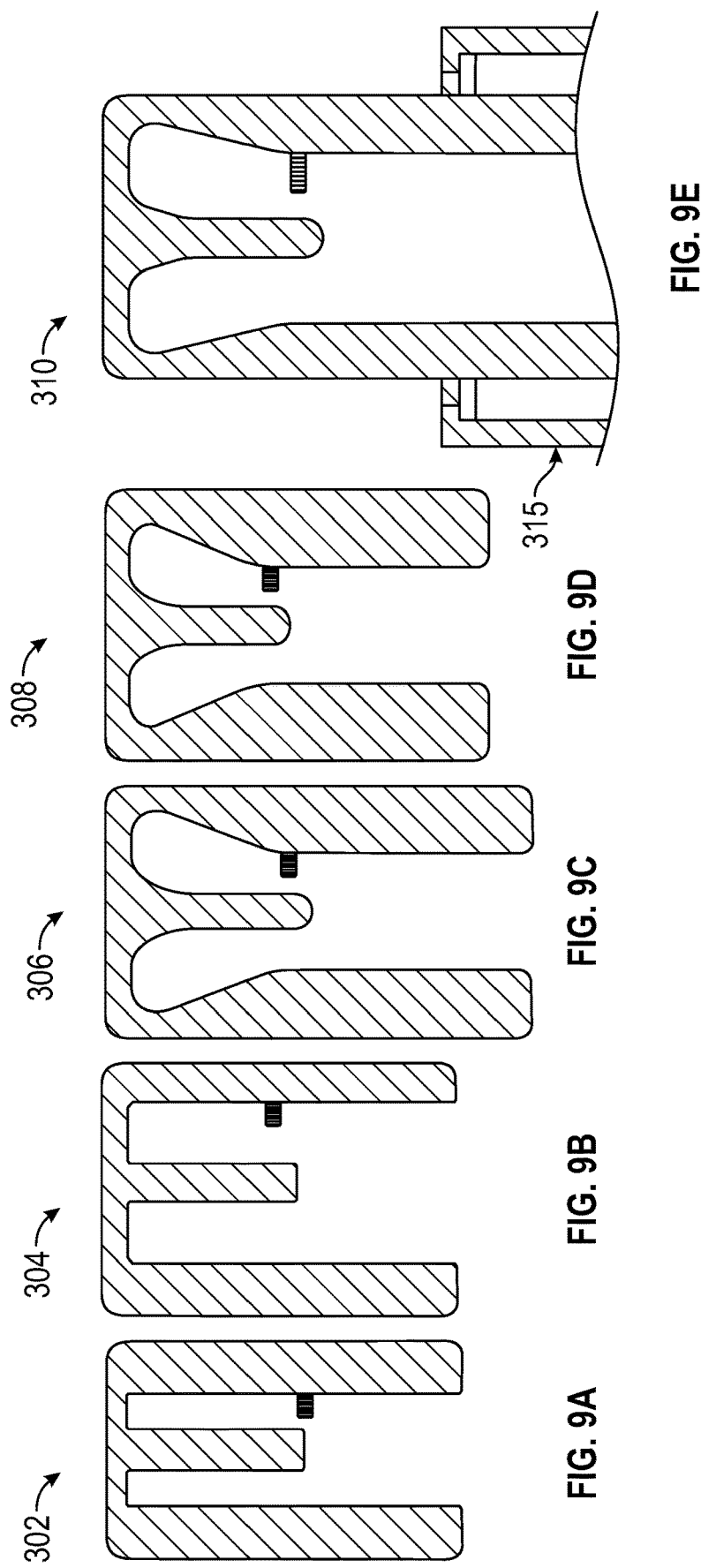

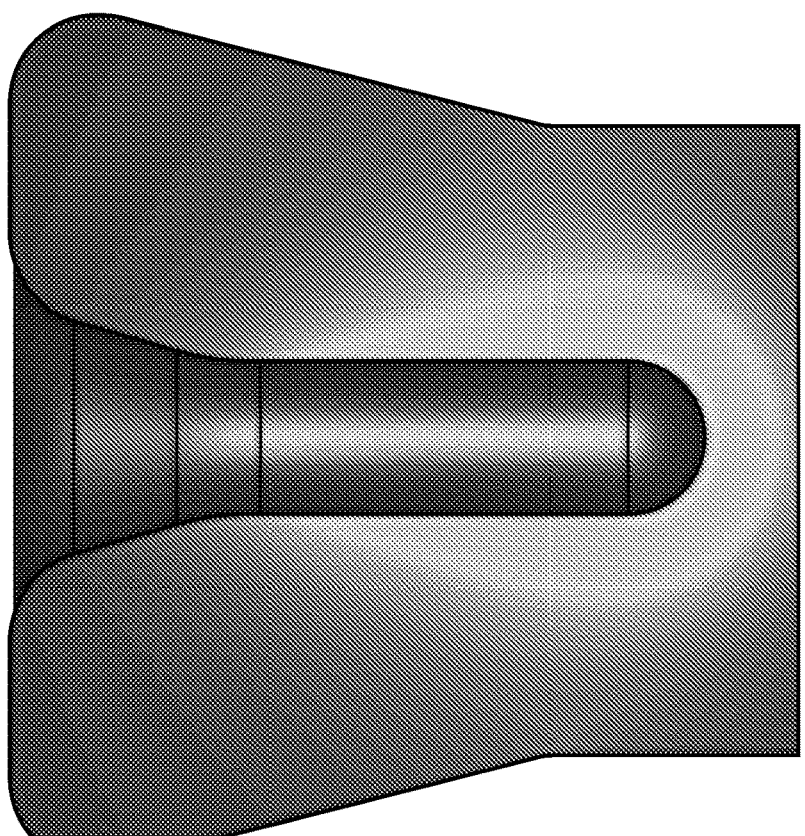
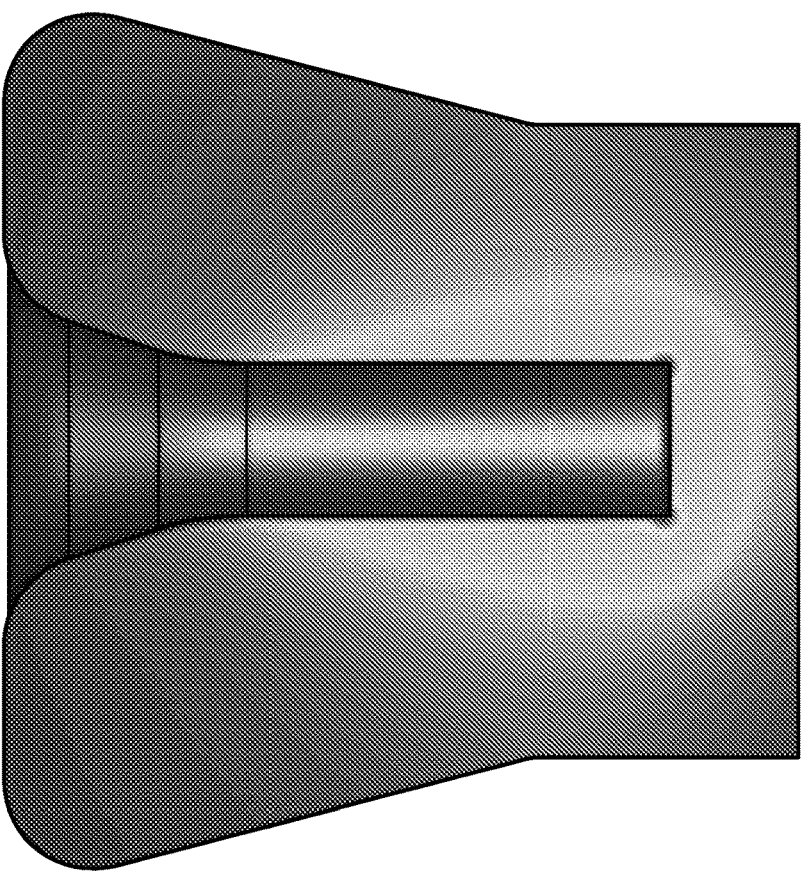
FIG. 10

QUANTUM COMPUTING STRUCTURES AND RESONATORS THEREOF

CROSS-REFERENCE TO RELATED APPLICATIONS

This application is the U.S. National Phase under 35 U.S.C. § 371 of International Application No. PCT/US2020/029364, filed Apr. 22, 2020, entitled QUANTUM COMPUTING STRUCTURES AND RESONATORS THEREOF, which claims the benefit of U.S. Provisional Application No. 62/837,655, filed Apr. 23, 2019, entitled "QUANTUM COMPUTING STRUCTURES AND RESONATORS THEREOF," which are hereby incorporated by reference herein in their entireties and for all purposes.

STATEMENT REGARDING FEDERALLY SPONSORED R&D

This invention was funded, in part, by government support under DOE Grant No. DE-SC0018753. The government has certain rights in the invention.

BACKGROUND

Field

The present disclosure relates to quantum computing structure, in particular to resonators.

SUMMARY

Quantum computers (QC) rely on quantum bits (or qubits), which is a very fragile two-level quantum system. Qubits enable the use of quantum superposition and multi-state entanglement in QC calculations. This allows for a QC to simultaneously calculate millions of computations at once. Entanglement lets a QC change the state of multiple qubits simultaneously via adjusting the state stored in a single bit, enabling computational power scalability unachievable with traditional computers.

However, a qubit state degrades rapidly due to the interaction with environmental degrees of freedom and added control channels. Described herein are resonators that can reduce the rate and/or degree of degradation of the qubit states. In some embodiments, Josephson junctions can be used, which may be located inside such a resonator.

BRIEF DESCRIPTION OF THE DRAWINGS

Certain embodiments of the present disclosure will now be described, by way of example only, with reference to the accompanying drawings. From figure to figure, the same or similar reference numerals are used to designate similar components of an illustrated embodiment.

FIG. 5 shows a schematic layout of a cQED module (left) and a schematic layout of a multi-qubit system (right).

FIG. 8a shows various machining cutter positions.

FIG. 8b shows various dimensions associated with a machining cutter.

FIGS. 9(a)-(e) shows various implementations with different blending radii and other dimensions.

FIG. 10 shows the E-field concentration in two different QWR cavity designs.

DETAILED DESCRIPTION

Figure 1:
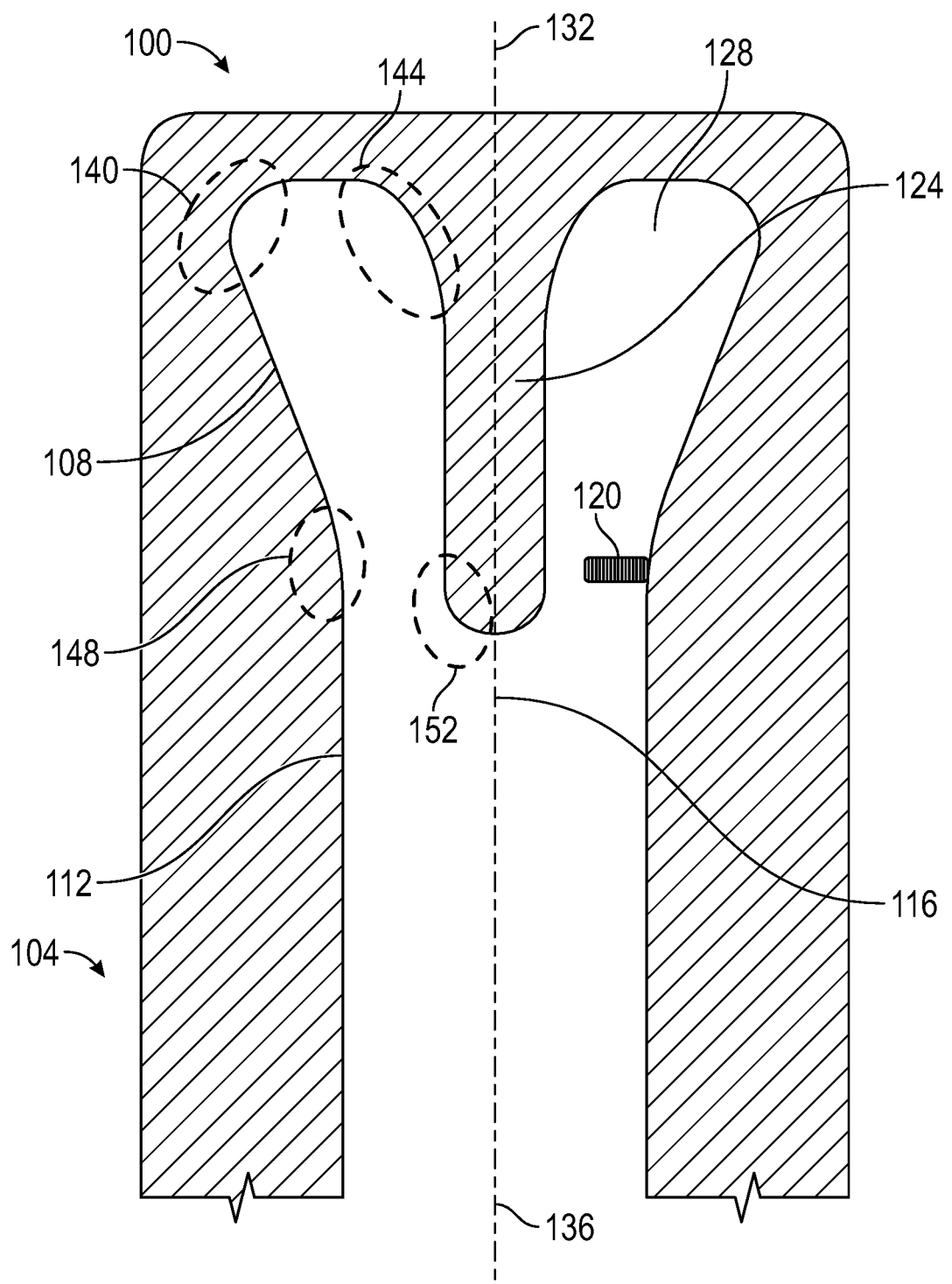
FIG. 1 shows a cross-section of an example quantum computing resonator, according to one implementation.

To facilitate an understanding of the systems and methods discussed herein, several terms are described below. These terms, as well as other terms used herein, should be construed to include the provided descriptions, the ordinary and customary meanings of the terms, and/or any other implied meaning for the respective terms, wherein such construction is consistent with context of the term. Thus, the descriptions below do not limit the meaning of these terms, but only provide example descriptions.

Qubit: data stored by a quantum computer or the structure for storing such data.

Quantum Computer: an arrangement that stores and reads qubits using quantum effects.

Resonator: a device for aiding the storage of qubits.

Nearly all areas of modern life are influenced by the incredible impact of computational capabilities. Quantum computers (QC), if realized, could disrupt many computationally intense fields of science; including several high-energy physics disciplines: cosmology, quantum field theory, particle interactions, and nuclear physics. The building block element of a QC is a quantum bit (qubit), which is a very fragile two-level quantum system. Qubits enable the use of quantum superposition and multi-state entanglement in QC calculations, allowing a QC to simultaneously calculate millions of computations at once. Entanglement lets a QC change the state of multiple qubits simultaneously via adjusting the state stored in a single bit, enabling computational power scalability unachievable with traditional computers.

Complex physical problems can require powerful machines consisting of many qubits arrayed in a high-speed network. However, a qubit state degrades rapidly due to the interaction with environmental degrees of freedom and the added control channels. One technical solution to improve qubit lifetimes and network interactions is a logical qubit comprised of a Josephson junction located inside of a high Q-factor superconducting 3D cavity. The quantum state excited in the Josephson junction physical qubit is protected from environmental noise and loss via the encoding qubits states in the high-Q resonant cavity modes. These logical qubits are controlled and coupled via microwave striplines.

Quantum computing is a developing field of technology for storing and reading information. Quantum bits, unlike classical or traditional bits, do not necessarily need to be binary (on or off) but may exhibit information representing a wide range of information. The information stored as qubits, or quantum bits, can be useful, but currently there exist challenges related to the readability of the information from the qubits amid the noise associated with quantum phenomena.

A resonator can be used in quantum computing to contain, control, and/or improve the electromagnetic field used to form, read, and/or modify the qubit. The qubit may be formed using a Josephson Junction. The resonator can be formed in a housing. The housing may include a cavity therein. The cavity may be at least partially evacuated, which may be helpful in increasing an insulating effect between two conducting interfaces. For example, a protrusion, tip, conductor, etc. may be disposed within the cavity and opposite a conducting element. A gap or slot may be formed between the protrusion and the conducting element.

The housing can define a resonator axis. Accordingly, the housing may have a proximal portion and a distal portion. The protrusion mentioned above may extend axially from the distal portion of the housing through a portion of the cavity. The protrusion having a proximal portion and a distal portion. Some embodiments may include two or more protrusions in the resonator. For example, the resonator may include a first protrusion from a distal end of the housing and a second protrusion from a proximal end of the housing. Reference to the figures will now be made.

FIG. 1 shows a cross-section of an example quantum computing resonator 100, according to one implementation. The resonator 100 includes a housing 104 disposed along a resonator axis 116. The housing 104 has a tapered portion 108 that extends from a housing distal end 132 to near a location of a qubit 120. The housing 104 further includes an elongate portion 112 that extends from near the qubit 120 location to a housing proximal end 136. The qubit 120 may be a transmon. The housing 104 defines a cavity 128 that extends from a cavity proximal end to a cavity distal end along a portion of the resonator axis 116. The housing 104 includes a protrusion 124 that extends axially from the housing distal end 132 along the resonator axis 116 to near the qubit 120 location. A proximal portion of the protrusion 124 may be a tapered portion. The tapered portion may be tapered relative to a base of the protrusion 124. The tapered portion may have a rounded transition, an abrupt transition, and/or any other type of transition. As shown, the tapered portion includes a rounded transition at the fourth transition 152. Other transitions of the resonator 100 are described in more detail below. The qubit 120 of the resonator 100 extends into the cavity 128 at the qubit 120 location. The resonator 100 is substantially symmetric about the resonator axis 116.

At the distal end 132 of the resonator 100 (e.g., at the distal end 132 of the tapered portion 108), an enclosure may be formed by a first transition 140, which may be smooth and/or rounded as shown. A second transition 144 may characterize the beginning of the protrusion 124 as it extends proximally from the distal end 132 of the resonator 100. The second transition 144 may smooth and/or rounded. The tapered portion 108 may transition into the elongate portion 112 at a third transition 148, which may be smooth and/or rounded. In some examples, the third transition 148 may be disposed (e.g., have a beginning, middle, end) at approximately the same axial level as the qubit 120 location. As noted above, the fourth transition 152 may characterize a proximal end of the protrusion 124. The fourth transition 152 may be smooth and/or rounded.

Figure 2:
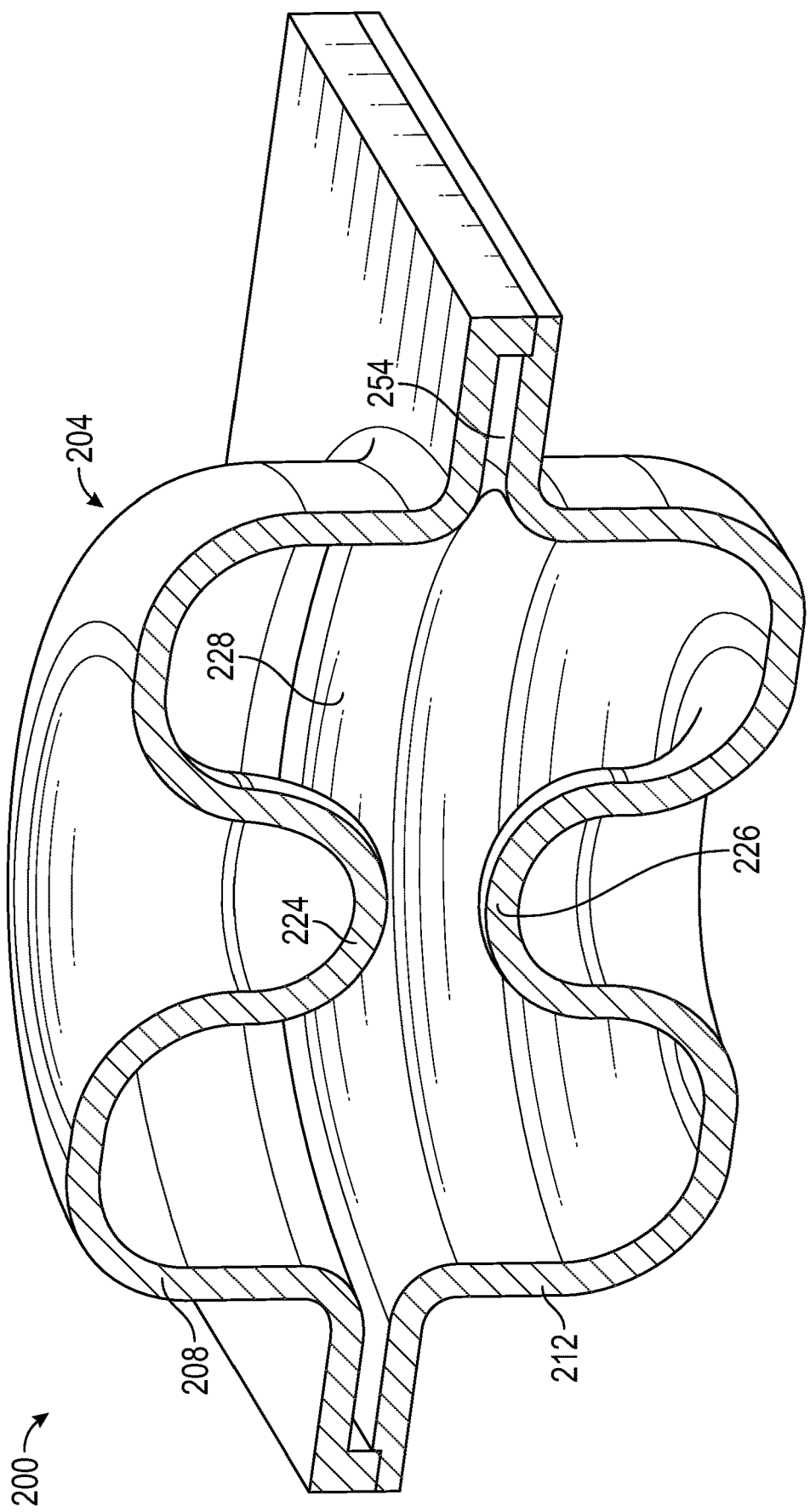
FIG. 2 shows a cross-section of another example of a resonator, according to one implementation.

FIG. 2 shows a cross-section of another example of a resonator 200, according to one implementation. The resonator 200 includes a housing 204 that has a first portion 208 and a second portion 212. As shown, the first portion 208 and second portion 212 are separate elements that have been coupled together (e.g., by welding, bonding, adhering, etc.). Together, the first portion 208 and the second portion 212 form a cavity 228. A gap 254 is formed between the first portion 208 and the second portion 212 at radially distal portions of the resonator 200. The housing 204 forms a first protrusion 224 and a second protrusion 226. As shown, the first protrusion 224 and the second protrusion 226 are aligned coaxially along a resonator axis (not shown).

In some examples, the resonator 200 may include a plurality of housing elements that can be joined together (e.g., bonded, adhered, etc.). For example, the resonator may include a proximal housing portion and a distal housing portion. The proximal housing portion may be joined to the distal housing portion. Such embodiments may apply to embodiments with one, two, or more protrusions.

A noted above, the resonator 200 includes a gap 254 disposed between two bonded portions 208, 212 of the housing 204. The gap 254 can extend radially from a main chamber of the resonator (e.g., as shown). The main chamber (e.g., the cavity 228) may cultivate a higher electric field than the gap 254. The gap 254 can have a width of between about 0.05 mm to 20 mm.

The resonator 200 can include a vacuum aperture (not shown) in fluid communication with the main chamber of the resonator. The vacuum aperture can be in fluid communication with a vacuum configured to draw fluid out of the resonator 200. In some embodiments, the vacuum aperture can be disposed within the gap 254, where the electric field may be lower than in the main chamber. This may allow the resonator to be evacuated from a region that is less likely to disturb the electric field of the resonator (e.g., in the main chamber). The proximal portion (e.g., the second portion 212) may be substantially surrounded by the cavity (e.g., vacuum).

The shape of the resonators described herein can have an improved quality factor (Q) and increase the coherence time of the qubit state in the quantum computer relative to previous resonators. This improvement can lead, for example, to longer-lasting quantum computations. This improvement can allow running more complex quantum algorithms (e.g., for solving more complex problems).

The conducting element may be coupled to superconducting electronics. The superconducting electronics may be maintained at very low temperatures, such as temperatures near absolute zero. For example, the electronics may be cooled to below about 5 K, below about 2 K, below about 1 K, etc. In some embodiments, the temperature is lower than about 150 mK and in some embodiments the temperature is below about 10 mK. Such low temperatures can, for example, reduce noise and improve readability of the qubits. Additionally or alternatively, the qubit may be formed using a transmon. The qubit may be a sole transmon or a transmon coupled to a superconducting RF cavity.

The cavity (e.g., cavity 128, cavity 228) of the resonator can have an inner diameter at or near a distal end of the cavity that is greater than an inner diameter of the cavity at or near a proximal end of the cavity. Inner diameter may be measured from opposing sidewalls of the housing (e.g., not including an intervening projection as in the case of the distal end of the cavity).

Figure 11:
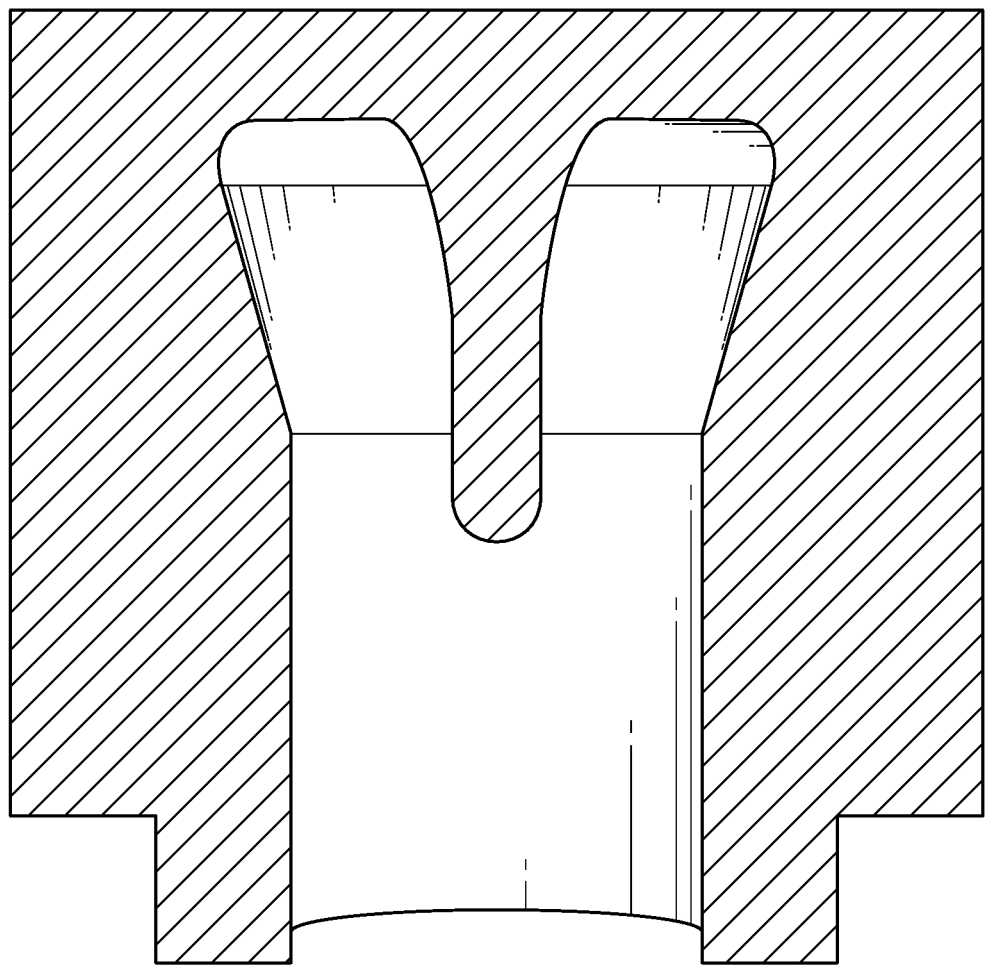
FIG. 11 shows an example QWR resonator that has been milled into metal.

The resonator can be formed of a solid and/or rigid material (see, e.g., FIG. 11). For example, the resonator may be made of metal, such as aluminum, copper, niobium, and/or other metals. Additionally or alternatively, an interior of the housing can be coated with a layer of a metal, such as niobium, over a different material (e.g., another metal).

The protrusion can be generally cylindrical. In some embodiments, the proximal and/or distal ends of the protrusion (e.g., the edges of the protrusion) can be blended. For example, the proximal end may be tapered (e.g., rounded). Additionally or alternatively, the distal end may increase in diameter to blend into the housing. The protrusion may have a minimum distance from the housing across the cavity near the proximal end of the protrusion.

The resonator can include various edges (e.g. transitions) between or within portions thereof, with each transition having a curvature that may be tuned to achieve an improved Q-factor. For example, transitions that may impact Q-factor include the first, second, third, and fourth transitions 140, 144, 148, 152 in FIG. 1 above, which are each curved and/or blended in a beveled or chamfered manner. In one implementation, only one of the transitions may be rounded (e.g., the fourth transition 152 of FIG. 1 above), with the other transition(s) being sharp edges and/or otherwise abrupt. In other embodiments, other combinations of the transitions may be smoothed to achieve a higher Q-factor, to satisfy manufacturing constraints, and/or otherwise optimize performance of the resonator.

In FIG. 1, the first transition 140 is disposed between a sidewall of the housing 104 and a distal end 132 of the housing 104, the second transition 144 is disposed between the distal end 132 of the housing 104 and the protrusion 124, the third transition 148 is disposed between the tapered portion 108 and the elongate portion 112 of the housing 104, and the fourth transition 152 is disposed at a proximal end of the protrusion 124. In one embodiment where shape of the transitions is optimized for an increased Q-factor, the transitions have the following characteristics:

- The first transition 140 (between a sidewall of the housing 104 and the distal end 132 of the housing 104) has a sidewall blend radius which may be between about x=0.01 mm to x=50 mm.
- The second transition 144 (between the distal end 132 of the housing 104 and the protrusion 124) has a base blend radius which may be between about y=0.01 mm and y=50 mm.
- The third transition 148 (a tapering of a housing 104 sidewall) has a tapering radius which may be between about w=0.01 mm and w=50 mm.
- The fourth transition 152 (a tapering of a proximal portion (e.g., the tip) of the protrusion 152) has a tip or rounding radius which may be between about z=0.01 mm and z=50 mm.

The transitions may be described in terms of ratios. For example, a ratio of the radius of curvature of the first transition 140 to a maximal gap width between the inner and outer conductors of the resonator may be between about 0.01 to 0.5. A ratio of the radius of curvature of the second transition 144 to a maximal gap width between the inner and outer conductors of the resonator may be between about 0.01 to 0.5. A ratio of the radius of curvature of the third transition 148 to a minimum outer conductor diameter of the resonator may be between about 0.01 to 1. A ratio of the radius of curvature of the fourth transition 152 to a minimum inner conductor diameter of the resonator may be between about 0.01 to 1. Other alternatives are possible. The frequency of the cavity that may be used may be between about 1 and 24 GHz. In some embodiments, the frequency may be between about 4 GHz and 16 GHz. The radius of curvature of one of the transitions described above may be adjusted inversely with the frequency that will be used in the resonator. For example, in some embodiments, the relevant radius of curvature may be multiplied by a scaling factor of a constant (e.g., 6) divided by the frequency in the resonator.

In some embodiments, dimensions of a resonator will scale approximately linearly with the frequency (as ~1/f), including the transitions, which are defined by the radius of the cavity. In view of the above, in an example implementation, the dimension of the transitions may scale with the factor R*(6 GHz/F)). In other implementations, dimensions may scale according to other factors and/or at different rates.

In some embodiments, the resonator can be formed of two or more sections or portions. For example, the distal end and proximal end may be formed of separate structures that are attached (e.g., adhered, welded, etc.) together. Thus, a seam may be formed. The seam may be disposed between the distal and proximal ends. One or more additional qubits may be disposed within the resonator. A second qubit, for example, may be disposed on a conductor that is between two sections of the resonator. Other variants are possible.

Additional details and/or examples are provided below. The information below should not be read to limit the embodiments that are possible. Rather, the features described should be viewed as examples.

Example Problems and Solutions

Niobium SRF cavities, used in particle accelerators, are able to reach quality factors of up to $\sim 10^{11}$, potentially enabling storage times approaching seconds, if adapted to a single-photon level. A 3D Superconducting RF (SRF) quarter-wave resonator (QWR) with shape improved for operation in the quantum regime can be beneficial. An example of a quarter-wave resonator is provided in FIG. 3. Additionally or alternatively, the QWR may include a plurality of qubits, as shown. However, some features of such shapes are traditionally challenging to machine with the surface finish targeted. Another problem is that currently logical qubits are produced separately which may require manual interconnections between cavity resonators, leading to performance limiting behavior and inability to scale to larger systems.

Figure 3:
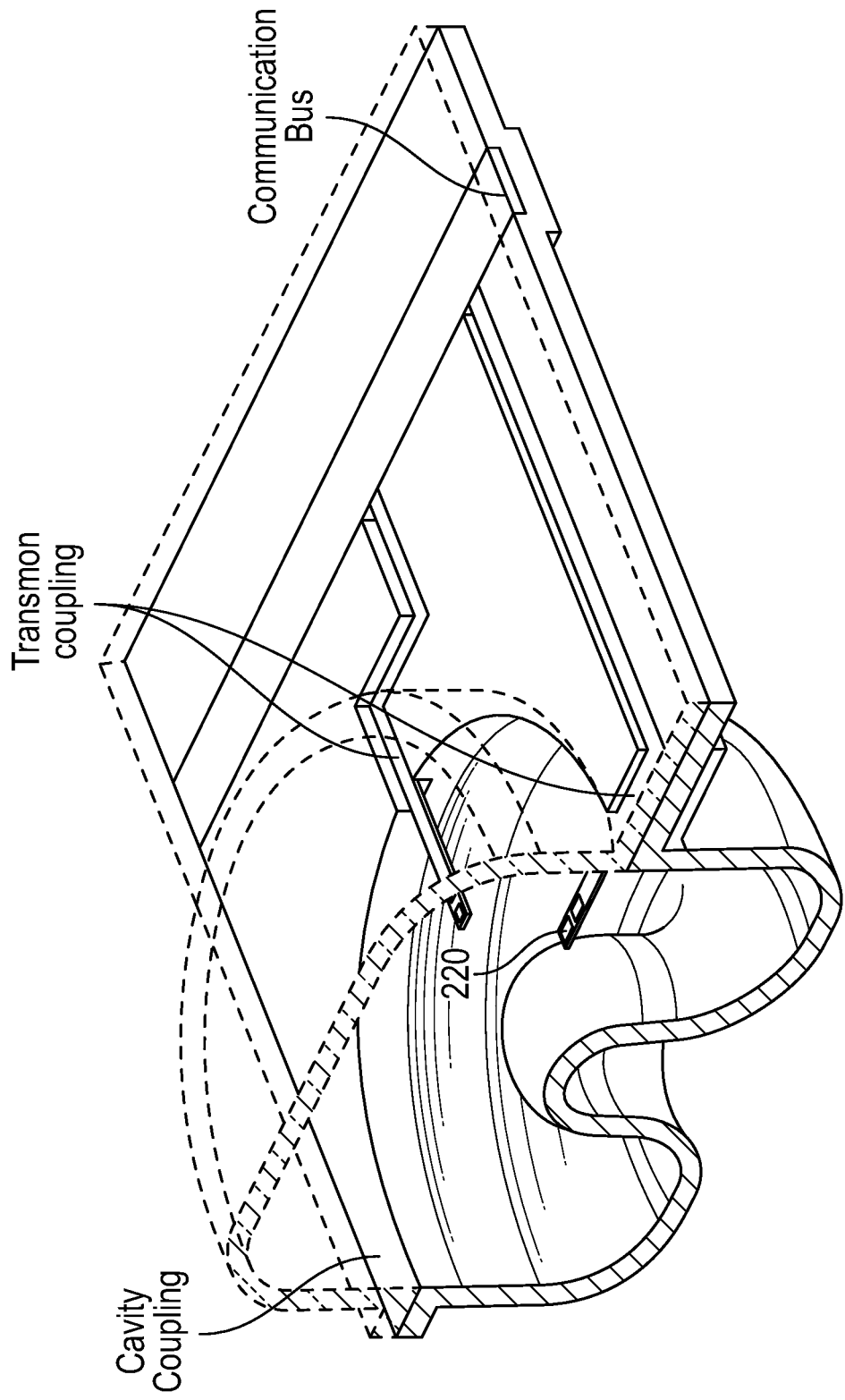
FIG. 3 shows an example of a quarter-wave resonator, according to one implementation.
Figure 4:
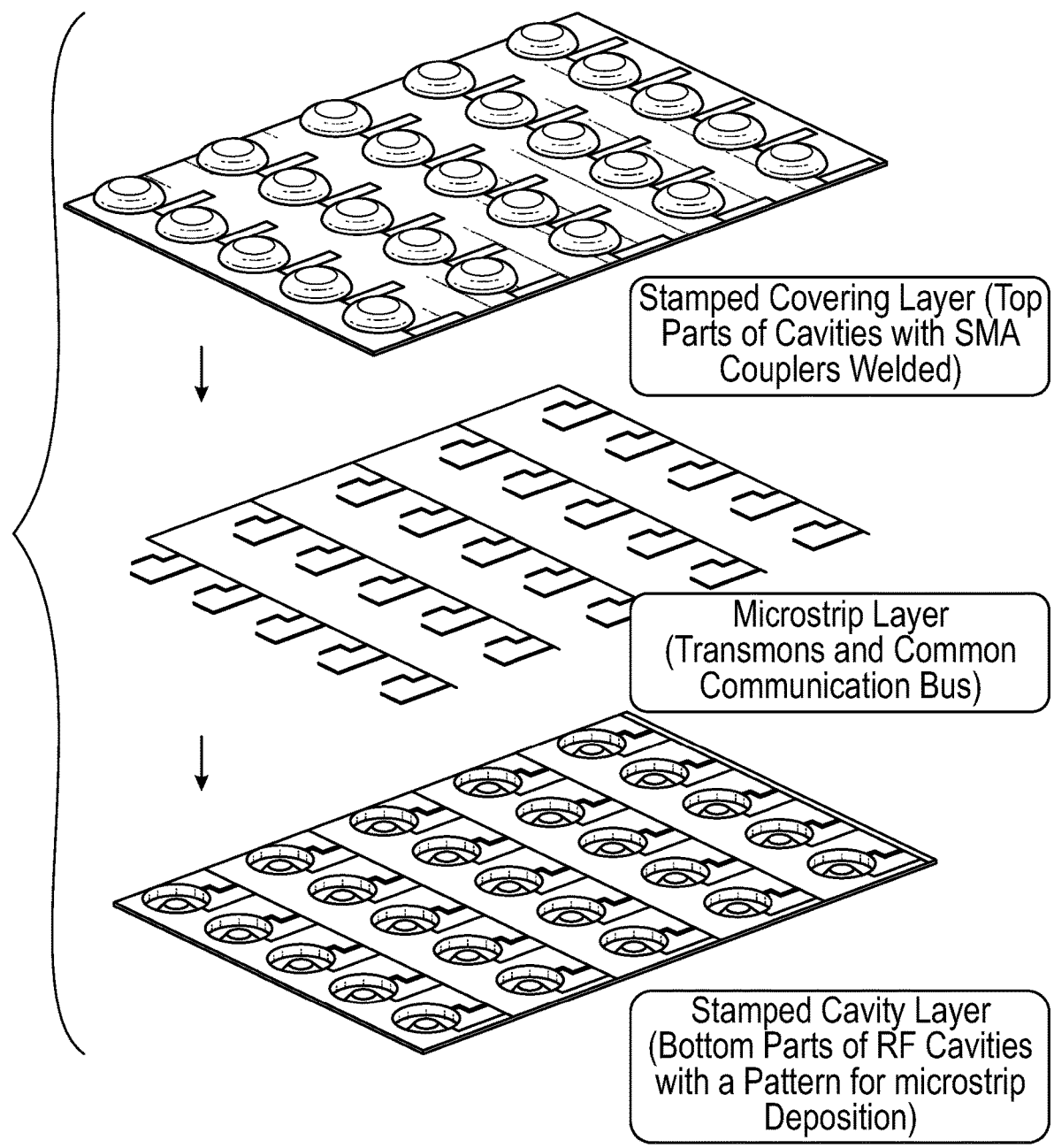
FIG. 4 shows an example fabrication technique for creating large number of resonators, such as quarter-wave storage resonators (QWR), according to one implementation.

FIG. 4 shows an example fabrication technique for creating large number of resonators, such as quarter-wave storage resonators (QWR), according to one implementation. The fabrication technique can be used that allows drawing of niobium sheet to create a large number of quarter-wave storage resonators (QWR) at once, quickly and easily. Deposition of the microstrip circuits can be used for coupling to the QWR qubits, as shown in FIG. 3. This fabrication technique reduces welded connections between the cavities, which may improve Q-factors. This system can be more favorable to scalable post-fabrication surface treatments such as cleaning, etching and baking, than separately fabricated cavities. Since the structure (e.g., resonator) can include a plurality of elements (e.g., two halves), it can have the advantages of a novel split-structure approach, including the cutoff gap with no EM-fields enhancement on the joint.

A layout of the multi-qubit system for two QWR qubits with a shape improved for niobium forming techniques (FIG. 4) can be used. A scaled multiple-qubit system can be achieved for an improved Q-factor and/or stripline cross talk. Besides traditional die forming techniques, hydro and electro-hydraulic forming methods which do not perturb the niobium surface finish relative to the niobium sheet starting point can be used. Other materials, such as aluminum, lead, or single crystal tin cavities as well as layers of Nb or $NbSn_3$ (e.g., sputtered on copper or other metal cavities) may be used. These can be advantageous also because they are cheaper and easier to fabricate. Surface processing techniques such as etching, electropolishing, baking (high and low-temperature), nitrogen doping, and high-pressure rinsing for the materials can be used.

Superconducting (SC) Josephson Junction circuit qubits can be used for building large-scale systems since with this technology the qubit-qubit coupling is straightforward.

Other advantages of SC circuits are: the qubits are conveniently manipulated with RF pulses, which have better noise properties than DC controls (quantum dots) and are much cheaper as well as less fussy than lasers (trapped ions); and the fabrication process of such circuits uses well established electron-beam and photo-lithographic procedures, which provide precisely engineerable Hamiltonians.

Among the SC qubits, one various approaches can be used, such as Circuit Quantum Electrodynamics (cQED), which extensively uses advantages of coupling SC circuits (or transmons) to high-Q cavities. The modular cQED systems reached a great success when for the first time experimentally, a quantum error correction (QEC) protocol was applied that preserved quantum information for milliseconds, longer than was physically possible in the not-corrected system, and longer than in any existing SC qubit ever. Furthermore, recent experiments on transferring multi-photon quantum states provide a way to connect distant modules and form a large-scale quantum information system.

An example cQED module layout is shown in FIG. 2 and includes the following units:
Qubit. The heart of the system is a SC microstrip circuit with non-linearity introduced by the Josephson junction. The non-linear element adds slight anharmonicity to the circuit making its energy levels non-degenerate, thus allowing to create arbitrary superpositions of them at will. In the cQED approach, this particular type of qubit is called a transmon—a charge-noise insensitive modification of the Cooper Pair Box circuits.
Resonator. Coupling an an harmonic oscillator (qubit) to a harmonic oscillator leads to a more sophisticated Hamiltonian, which, however, shows some additional useful features. For the case when resonator frequency is far detuned from the transmon excitation frequency, cavity frequency becomes shifted by an amount which depends on the qubit state. This enables the quantum non-demolition read-out by frequency-domain reflection measurements.
Ancillary qubit. Experiments on quantum gate teleportation between the modules need more controllable Hamiltonian, which they achieve by introducing an additional qubit.
SRF cavity. The cavity mainly plays the role of the quantum memory. Coupling a non-linear element (qubit) to the cavity adds a slight anharmonicity which is, however, enough to address the states of the cavity individually. The cavity states may be used to store the qubit state in the high-Q modes, however, the modern approach is to use the 'Schrodinger cat' states instead, which allows applying error-correction algorithms. The transmon-cavity modules in multi-qubit experiments are usually connected with the RF transmission lines. They serve as quantum buses for delivering entanglement photon states emitted by the transmon-cavity modules.

FIG. 5 shows a schematic layout of a cQED module (left) and a schematic layout of a multi-qubit system (right). Three-dimensional SRF resonators are particularly interesting for Quantum Information Systems (QIS), since are easily integrated with superconducting circuits and can reach very high-quality factors, enabling storage times approaching seconds.

The decay time and thus the ultimate coherence time that a resonator can provide is proportional to its loaded Q-factor:

$$T = \frac{2Q_L}{\omega},$$

where $\omega$ is angular frequency of the cavity. The loaded Q factor includes several loss mechanisms: RF losses in the walls, dielectric losses and external losses, and is calculated as $$\frac{1}{Q_L} = \frac{1}{Q_0} + \frac{1}{Q_D} + \frac{1}{Q_{ext}}.$$

The external Q-factor models the losses related to power leaking from the resonator excitation system. Dielectric losses are mainly defined by the losses in the Josephson junction substrate. The most beneficial of all three is the intrinsic (or unloaded) Q-factor ($Q_0$), which is the ratio of the stored energy to the power dissipated in the cavity to maintain the stored energy $$Q_0 = \frac{\omega W}{P}.$$

In SRF cavities the unloaded Q-factor can be defined as $$Q_0 = \frac{G}{R_s}.$$

Here, G is the geometric-factor, which ranks the cavity's effectiveness in providing the "useful" electric field due to the influence of its shape alone and excludes specific material wall loss. The higher G results in higher $Q_0$ and thus indicates a better cavity design. $R_S$ is the surface resistance, defined by the material and operating conditions. The surface resistance $R_S$ can be expanded to two terms: BCS-resistance and residual resistance, $R_S = R_{BCS} + R_{res}$. The BCS-resistance is explained by the Bardeen-Cooper-Schrieffer theory that the superconducting Cooper pairs, which have zero resistance for DC current, have finite mass and momentum that has to alternate sinusoidally for the AC currents of RF fields, thus giving rise to a small energy loss. BCS resistance for niobium depends on frequency and temperature, $$R_{BCS} \sim \frac{A}{T} f^2 e^{-\frac{\Delta T}{kT}},$$

and thus, one should keep the frequency and temperature as low as possible to increase the unloaded Q-factor. The residual resistance arises from several sources, such as random material defects, oxides and hydrides that can form on the surface due to hot chemistry and slow cool-down, and other sources related to cavity processing and surface treatment.

Therefore, there are at least two ways to improve cavity Q-factor: increase the G-factor of the cavity by improving its shape (reduce both dielectric and magnetic losses), and reduce the residual resistance of the cavity by improving the resonator surface quality during the design (avoid mechanical junctions in the areas with EM fields), fabrication (surface finishing) and treatment (polishing, removal of the oxides, hydrides etc.)

Quarter-wave resonators (QWR) have been studied for use in QIS and were found to be a promising solution, due to the large mode separation, good coupling to a Josephson junction, and smaller influence of the connection seam, if the seam location is placed anywhere above the center conductor of the coaxial line. Although the functionality of such cavities has been demonstrated generically, their design is improved as described herein for an improved accelerating field, while QC cavities can be improved for coupling to a single photon and to operate at very low-field levels.

A QWR with an improved shape, shown in FIG. 11, may be used to increase the G-factor of the cavity by 65%. The calculation of the losses in a dielectric layer of $Nb_2O_5$ were also performed and demonstrated that thanks to the reduction of area with high electric fields, we can expect the Q-factor at least twice higher than of the non-improved cavity.

Viable manufacturing options for the QWR should consider quality, cost and scalability. For simple single unit prototypes, it is reasonable to utilize conventional machining approaches such as milling and turning. High surface finishes are achievable through this route. However, the conventional methodology is not very scalable and scraps quite a bit of the raw material as it is a subtractive approach. Conventional die forming and hydroforming for small piece parts presents a nicely scalable solution, as an array of cavities can be manufactured simultaneously. This approach does suffer from potential surface damage from the die contacting the cavity and limited material strain handling. This results in degraded surface finishes and the potential for contamination embedment. Finally, in the more recent past a new technique, electrohydraulic forming, has emerged as a potential technology for scalable high quality manufacturing. Original sheet surface finishes are readily maintained and due to the reduced material strain exhibited in the process, strain rates higher than those for conventional sheet forming can be achieved.

Multi-qubit modules may be used as a base on superconducting QWR cavities with high G-factor shaped, compatible with a superconducting transmon, and coupling microstripline bus. The technique may allow cost and time efficient fabrication of modules with large number of cavities and produce cavities with high surface finishing, available for post-fabrication surface treatment, and diagnostic tools for operation in 10 mK single-electron regime. Table 1 summarizes example parameters for such cavity design.

Electromagnetic design improvement of the double-qubit module, including the incorporation of the resonator cavity, transmons and microstripline may be undertaken. In this step, existing design of the multi-qubit module may be reviewed and adapted for improved cavity design and drawing fabrication. The die forming may set certain limits of the cavity shape due to the maximum material strain. Operation at higher frequencies may cause the module to be less sensitive to these limits. Fabrication out of niobium sheet using the traditional forming techniques may be done to verify the targeted surface finish and confirm feasibility for further surface treatment.

TABLE 1

Example parameters of the SRF cavity for QIS.

| | |
|---|---|
| Unloaded Q-factor | $10^8$-$10^{10}$ |
| Coherence time | 1-100 ms |
| Frequency | 6-10 GHz |
| Temperature | 10 mK |
| Input power | $10^{-23}$ W |
| Field strength | 1 mV/m |
| Material | Niobium |
| Number of cavities per module | 2-8 |

Electro-hydraulic forming methods may be used that do not perturb the niobium surface finish relative to the niobium sheet starting point but may require a rather expensive initial investment in equipment.

This technical approach is innovative because the fabrication techniques have not been used and/or improved for cQED systems. In particular, the adaptation of the niobium forming technique for multi-qubit module may allow quick and inexpensive fabrication of large-scale systems with excellent quality of the inside surface of the cavity. A second innovation is the use of the improved high G-factor QWR resonator. Surface treatment procedures for niobium can be adapted to improve the Q-factor by reducing the surface contamination of the cavity. Ringdown measurements of the cavity Q-factor can be adapted for a single photon regime to allow Q-factor measurements beyond $10^8$.

High energy physicists devote enormous computing resources to lattice gauge theory calculations, which have substantially advanced our knowledge of nonperturbative quantum chromodynamics. However, those computations simulate field theories in imaginary time and hence can explore only static properties like hadron masses and matrix elements. Simulating the real-time evolution of quantum field theories is a hard problem classically yet might be done with a quantum computer using resources that scale reasonably with the energy, number of particles, and the desired precision. Such simulations could explore the behavior of nuclear matter at nonzero density, or far from equilibrium, and could be used to estimate QCD backgrounds with improved accuracy compared to classical methods. Quantum computing may also be a powerful tool for probing nonperturbative string theory, providing valuable guidance concerning the relation of strongly-coupled field theories to their gravitation duals in cases, like non-supersymmetric cosmological spacetimes, where understanding is currently lacking.

Specific interest in quantum computing comes with the number factorization algorithm. The successful implementation of this algorithm would release a treasure trove of information locked up by mathematics. While the most visible example of the power of quantum computers, it is not the only one, and there may be ways to leverage quantum mechanics in engineered systems differently. Fantastic protocols exist that allow secret or encrypted communication, money impossible to counterfeit, and the fast search of information databases.

A high-frequency, scalable multi-qubit SRF module for QIS can be used. A double-qubit system based on quarter-wave resonators, for example, may be done by drawing niobium sheet. A resonant frequency of about 1 GHz detuned from the transmon excitation frequency can be used. This is helpful to establish the dispersive coupling between the transmon and the resonator. The characteristic impedance to be a convenient value 50Ω. The width W of the strip line and depth H of the dielectric layer (FIG. 6) can be varied. The devices can be fine-tuned with our simulations.

Figure 6:
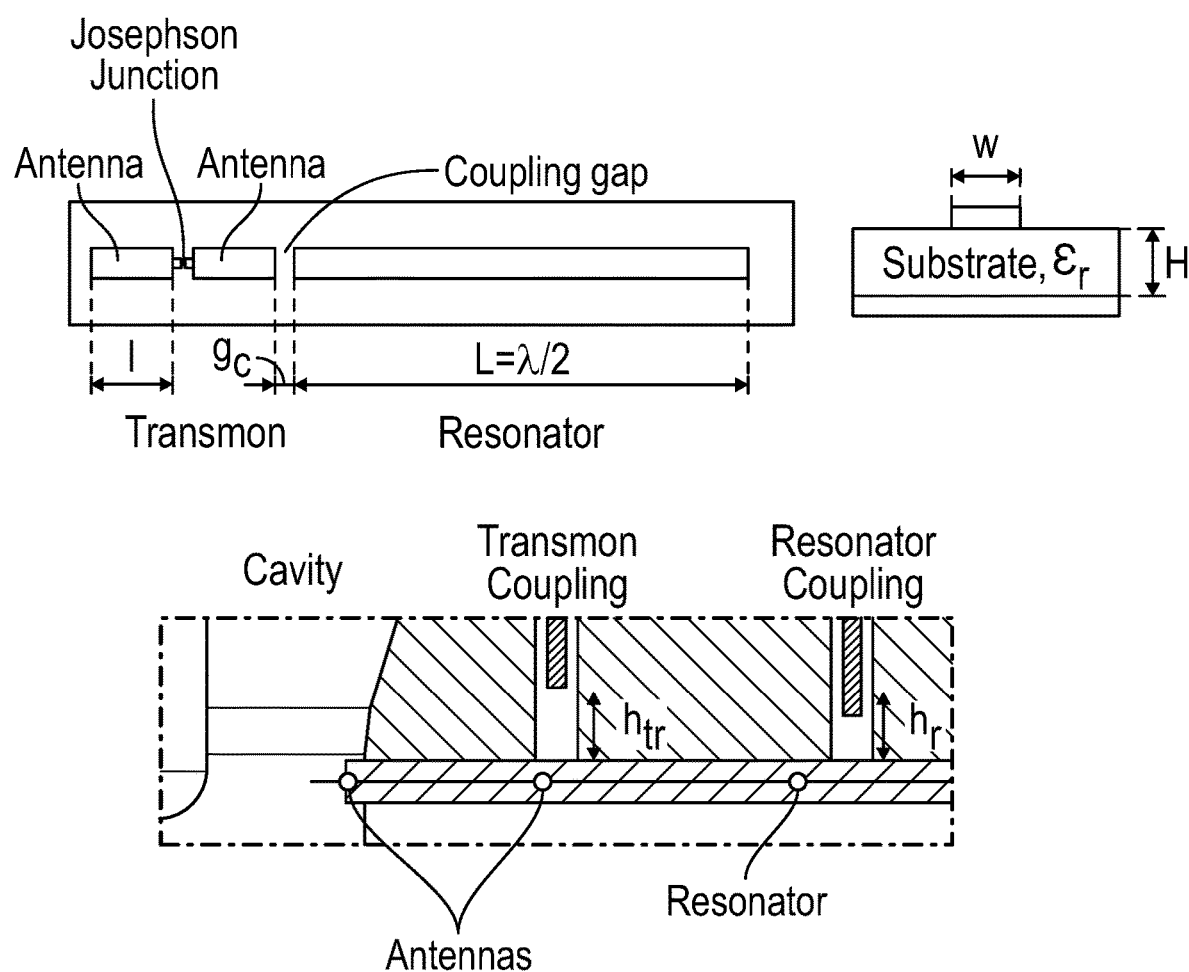
FIG. 6 shows a schematic layout of a transmon that is coupled to a read-out resonator (top) and a schematic view of a microstrip layer (bottom).

FIG. 6 shows a schematic layout of a transmon that is coupled to a read-out resonator (top) and a schematic view of a microstrip layer (bottom). The parameters of the transmons, as well as the couplings to the cavity modes may be calculated using finite-element simulation and a well-established Black Box Quantization technique. In this approach, the whole system, including Josephson junctions, can be determined or simulated using a set of linear resonant-elements with frequency-domain solver. The Josephson junction in these simulations is modelled as lumped linear inductance. The voltages across the Josephson junctions can define the non-linear part of the full Hamiltonian. The non-linearity is then added as the perturbation as described in and after the numerical re-diagonalization the full Hamiltonian of the system is obtained.

The Hamiltonian provides the self- and cross-coupling strengths of the devices of the system (cavities, transmons, and resonators). Simulations and geometrical adjustments can be repeated iteratively until the needed parameters are reached. In particular, we monitor that each transmon-cavity coupling strength and that each detuning between the cavity photon and transmon transitions satisfy the dispersive coupling limit. During the geometrical adjustments we also take care that each transmon preserves its anharmonicity α, as well as that undesired cross-couplings remain relatively small.

The transition frequencies and cavities-transmons-resonators couplings may be calculated. The coupling ports can be introduced into the system. In order to provide with low-photon excitations, the transmons coupling strength may be $\beta \sim 0.01$. This large under-coupling also minimizes dissipations caused by coupling to the environment. Readout resonators are designed to be overcoupled in order to minimize their loaded Q-factor.

The prototype engineering design can include a single two piece cavity and/or integrate the microstrip circuits into the trace cutouts on the niobium sheets. Die forming techniques may be used in order to achieve various secondary processes. For example, the cavities can be designed to be friendly for chemical processing and/or slightly oversized to account for shrinkage at cryogenic temperatures. The cavity geometry may also take into account typical strain limits for die forming with a target of 175% strain.

The device may be targeted to operate at cryogenic temperatures. Accordingly, proper thermal strapping may be undertaken to ensure reasonable cool down times. The SC properties may be very sensitive to external magnetic fields. Accordingly, a double walled magnetic shield manufactured (e.g., from Cryoperm 10) can be designed with a high shielding factor. Traditional magnetic shielding materials such as mild steel or even mu-metal may not work at these low temperatures due to their decreased magnetic permeability at low temperatures. The materials including SMAs for the power coupling may be non-magnetic. Material springback, tearing and surface finish preservation may be considered. Additionally, or alternatively, hydraulic and/or electro-hydraulic forming may be utilized on the RF surface.

Proper circuit operation within the niobium sheets may be monitored. Careful selection of the circuit substrate, circuit geometry and transmission characteristics are helpful to increase proper circuit impedance matching and minimize susceptibility to EMI.

Die forming of cavities is a relatively robust and technically mature process by which male and female dies are manufactured out of a reasonably hard material in comparison to the base metal to be worked and must not gall with the base metal. Design restrictions set above may ensure that feature sizes and the strain rates permissible in die forming are not exceeded. Improved thickness high RRR material may be utilized and no post-forming annealing may be done.

The strip line cutouts in the metal (e.g., niobium) sheet may be fabricated through sinker EDM and/or conventional machining as these features may be too small to fabricate through the die forming processes. Strip line chips can be clamped between niobium sheets in order to fixate micro strips and qubits position in the vacuum volume created by cutouts.

Due to a potential deep damage layer from the die forming technique, it may be helpful to aggressively chemically etch the cavities after fabrication.

When dealing with a very narrow bandwidth (in the order of a few Hz) any measurement may be affected by noise and resonant frequency shifts due to the microphonics. These effects may limit the Q-factor that can be measured using frequency-sweep methods to $Q \sim 10^8$. In order to avoid these effects, the decay time of the cavity, may be measured excited at a resonant frequency in a given moment of time. One way to do so is to design a positive-feedback or self-excited loop (SEL) which may provide an automatic excitation at the resonant frequency.

Components of the SEL may include: a set of attenuators and amplifiers that establish feedback gain, a phase-shifter that compensates the phase-length of the circuit, and/or RF limiter to control the stored energy level and the voltage-controlled fast SPST switch.

Advanced cavity treatment can be achieved by novel surface preparation techniques such as chemical and electro-polishing, high pressure rinsing, high and/or low-temperature baking, nitrogen doping and/or special cooldown procedures to eliminate the residual resistance contribution from trapped DC magnetic flux. Some of these procedures can be adapted for the quantum regime as well. The residual resistance may be reduced to improve the Q-factor of the cavity.

The cavity may be placed in a dilution refrigerator at low (e.g., 10-50 mK) temperatures to work in a single-photon regime. The fabricated sample, enclosed in a cryoperm magnetic shielding can be put on a 50 mK stage of an adiabatic demagnetization refrigerator, enclosed in a copper light-tight shield, and/or surrounded by a magnetic shield at around 4 K. All screws and coaxial connectors can be made with non-magnetic materials. The use of non-magnetic materials inside the 4 K magnetic shield can reduce the residual magnetic field at the sample, e.g., from 100 mG to 3 mG.

Q-factor may be measured using two methods: frequency and time domain. The latter method is new for the qubit cavities measurements. In the second method, the transmission coefficient S21 of the 50 mK resonators is measured with a vector network analyzer (VNA). The cryostat microwave input cable has 40 dB attenuation at room temperature and 30 dB attenuation at the 4 K stage, followed by 50 mK microwave powder filters with 1 dB attenuation before the connection to the sample's central transmission line. The sample's output passed through a second 50 mK microwave powder filter followed by a circulator at 4 K, which protects the resonators from noise originating in the high electron mobility transistor (HEMT) amplifier (noise temperature 4.5 K) also located at 4 K. The Q-factor may be measured by these two methods to exclude the Q-factor limitation due to the measurement errors.

Additional Examples

Superconducting RF resonators are particularly interesting for Quantum Information Systems. First, they are easily integrated with superconducting circuits. Then, the high-dimensional spaces of Hilbert states of RF cavities can open up new avenues for continuously-variable quantum information processing. Beneficially, superconducting three-dimensional microwave cavities can reach very high-quality factors, enabling storage times approaching seconds.

The decay time and thus the ultimate coherence time that a resonator can provide is proportional to its loaded Q-factor:

$$T = \frac{2Q_L}{\omega},$$

where $\omega$ is angular frequency of the cavity. The loaded Q factor includes several loss mechanisms: RF losses in the walls, dielectric losses and external losses, and as $$\frac{1}{Q_L} = \frac{1}{Q_0} + \frac{1}{Q_D} + \frac{1}{Q_{ext}}.$$

The external Q-factor models the losses related to power leaking from the resonator excitation system. Dielectric losses are mainly defined by the losses in the Josephson junction substrate. The most beneficial of all three is the intrinsic (or unloaded) Q-factor ($Q_0$), which is the ratio of the stored energy to the power dissipated in the cavity to maintain the stored energy $$Q_0 = \frac{\omega W}{P}.$$

In SRF cavities the unloaded Q-factor can be defined as $$Q_0 = \frac{G}{R_s}.$$

Here, G is the geometric-factor, which ranks the cavity's effectiveness in providing the "useful" electric field due to the influence of its shape alone and excludes specific material wall loss. The higher G results in higher $Q_0$ and thus indicates a better cavity design. $R_S$ is the surface resistance, defined by the material and operating conditions. The surface resistance $R_S$ can be expanded to two terms: BCS-resistance and residual resistance, $R_S = R_{BCS} + R_{res}$. The BCS-resistance is explained by the Bardeen-Cooper-Schrieffer theory that the superconducting Cooper pairs, which have zero resistance for DC current, have finite mass and momentum that has to alternate sinusoidally for the AC currents of RF fields, thus giving rise to a small energy loss. BCS resistance for niobium depends on frequency and temperature, $$R_{BCS} \sim \frac{A}{T} f^2 e^{-\frac{\Delta T}{kT}},$$

and thus, once should keep the frequency and temperature as low as possible to increase the unloaded Q-factor. The residual resistance arises from several sources, such as random material defects, oxides and hydrides that can form on the surface due to hot chemistry and slow cool-down, and other sources related to cavity processing and surface treatment.

The requirement for the Q-factor is driven by the desired coherence time of ~1 sec, and the typical Q values for accelerator cavities ($Q_0 > 10^{10}$). Standard frequencies of qubit cavities are 1-24 GHz, driven by the requirement that the resonant circuit must be in quantum mechanical ground states, i.e., all metallic parts need to be made out of a material that has virtually zero resistance at the qubit operating temperature and at the qubit transition frequency. The BCS resistance of SRF cavities increases with the square of the frequency. Thus, the operating temperature may be in the mK range; the lower limit is defined by the availability of commercial dilution refrigerators. Input power and field strength correspond to single photon coupling with a Josephson Junction. Finally, low-temperature superconductors such as aluminum or niobium are ideal for use in qubit resonators. Niobium implementation and treatment procedures are very well established in the accelerator community, and high geometric quality aluminum cavities are easily fabricated, however they may require additional surface treatment process development.

Improvement of the qubit cavity shape can provide a better Q-factor and thus, a larger lifetime of quantum memory. Numerical simulations may be used to show improvements in Q-factor and/or to decrease energy dissipations in the cavity. For example the G-factor parameter may be used to measure shape-defined losses since it defines the efficiency of the developed shape. Additionally, shunt impedance R defined by a voltage drop over qubit (FIG. 1, left) may be used to measure the effectiveness of cavity-qubit coupling, with a of developing a shape with higher G-factor and maximum shunt impedance. Connection of the cavity halves may also be considered in optimizing the cavity shape. In general, a seam introduces surface resistance causing surface currents to dissipate more quickly. Therefore, minimization of the magnetic field on the seam may be preferred.

Figure 7:
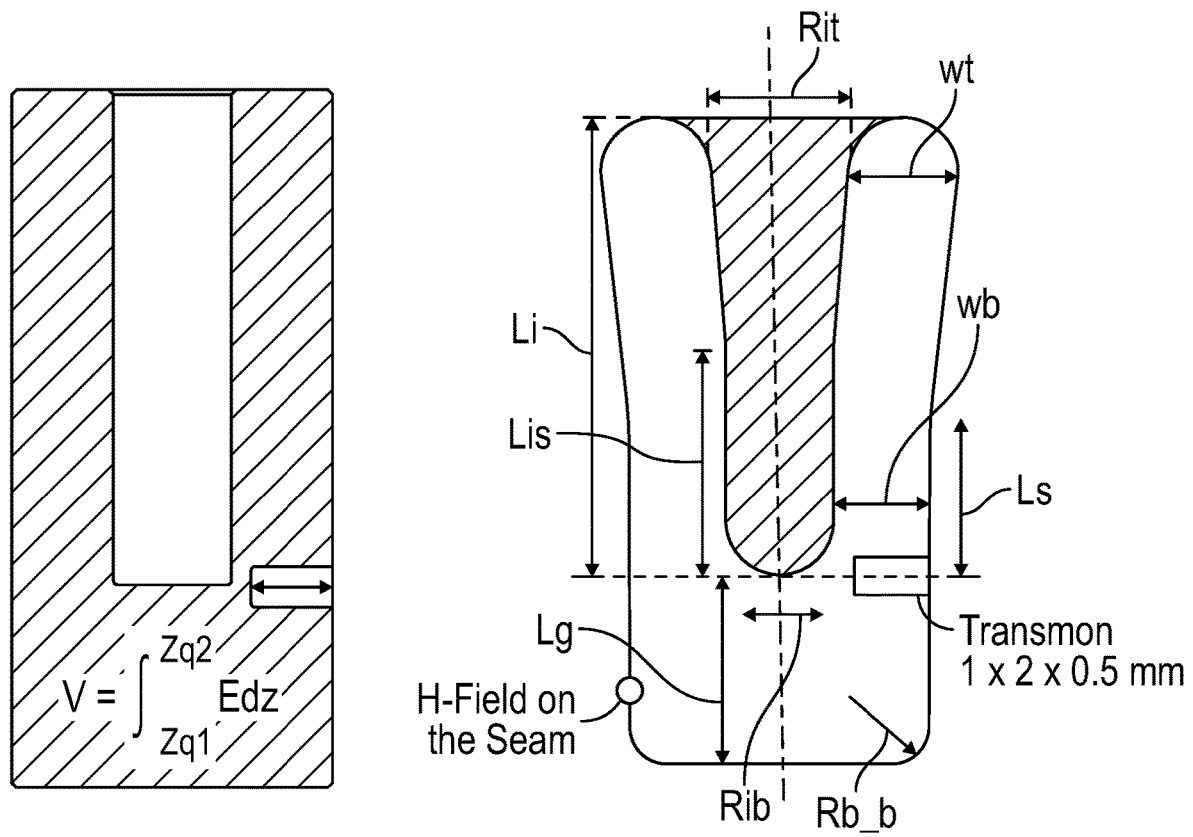
FIG. 7 shows a cross-section of a simple QWR geometry (left) and a modified geometry (right).

FIG. 7 shows a cross-section of a QWR geometry (left) and a modified geometry (right). In this example, a reference model is a straight QWR shape (FIG. 7, left). Simulated RF parameters of the reference design are presented in Table 2.

TABLE 2

| Simulated RF parameters of the QWR cavity | |
|---|---|
| Frequency f, GHz | 6.0 |
| R/Q, Ω | 46.8 |
| G, Ω | 44 |

An example shape of the 72.5 MHz QWR cavity is described herein. However, other frequencies below 2 GHz may be used. This geometry can achieve high-power accelerating fields with limitations on maximum surface electric field and surface magnetic fields of 35 MV/m and 50 mT respectively. These limitations are introduced by E-field stimulated emission and thermal superconductivity breakdown caused by surface currents induced by surface H-field. Though for low-power quantum applications these surface fields limitations are less relevant, the SRF cavities shape improvement approach helps to reach better G-factor by reducing peak and integral surface H-fields. Other shapes can be achieved by adjusting the geometrical parameters presented in FIG. 7 (right).

FIGS. 8*a* and 8*b* show various machining cutter positions. Machining fabrication puts limits on the cavity dimensions. Machine cutter should fit in end positions shown in FIG. 8*a* to produce the complex curvature. By analyzing cutter and cavity dimensions (FIG. 8*b*), a relation was inferred:

$$w_b = l_1 l_3 + w_c \quad (1)$$

where $l_1$, $l_3$ are outer and inner conductor tapering parameters; Width of the cutter $w_c$ is defined by minimization of cutter vibrations during the machining process. The relation generally means that for bigger tapering, the gap width may be increased. Therefore, the dependences of RF parameters on these dimensions can be adjusted simultaneously.

The geometry of the top part of the cavity can be modified. For the QWR geometry, this is the region where the major part of the magnetic field is concentrated, thus by affecting this part of the resonator, the G-factor may be improved.

Geometries with different blending radius of the top part of the cavity (see, e.g., FIGS. 1, 2, 7, 8*a*, 8*b*, 9: parameter $R_t$) can be simulated. FIGS. 9(*a*)-9(*e*) show various implementations 302, 304, 306, 308, 310 with different blending radii and other dimensions ((a)-(e)). The resonator 310 includes an RF choke 315 that is configured to reduce high frequency signals. Simulations results showed a slight improvement in G-factor. Blending sharp edges helped to spread surface H-fields concentrated locally on the top-cap flat regions. Thus, a more uniform H-field distribution along the top-cap surface, which results in a better G-factor, may be achieved. Therefore, this parameter may be kept high (e.g., as large as possible) for following improvement steps.

With reference to the outer conductor blending, the shape of inner and outer conductors may be improved by adding tapering. For example, this geometry feature may be adjusted by varying radius $R_{it}$ of the top part of the inner conductor.

Tapering shape may be further improved by adjusting tapering start point for the inner and outer conductors ($L_{is}$ and $L_s$ parameters). Lowering of the inner conductor tapering coordinates may result in an increase of the volume where the H-field is stored. This may lead to lower surface H-fields on the inner conductor and improvement of the G-factor (FIG. 10). In this example, R/Q is lowered with decreased $L_{is}$ as the E-field redistributed along the inner conductor towards the surface bending.

In some embodiments, lowering of outer tapering start coordinate, $L_s$ helps to increase the overall H-field volume. Therefore, increased $L_s$ redistributed magnetic field from the dissipative surfaces into the volume, as well as additionally decreased H-field intensity on the outer conductor by increasing its surface. This resulted in significant improvement of the G-factor.

FIG. 10 shows the E-field concentration in two different QWR cavity designs. In QWR cavities, the most of E-field is concentrated on the tip of the inner conductor. Sharp edges of the straight geometry of central pin are typically the places where the E-field is over concentrated (FIG. 10, left). This feature may be blended to reach a more uniform E-field distribution (FIG. 10, right). The E-field may be calculated using integrals in a thin $5 \cdot 10^{-8}$ m layer for both models. For example, in some embodiments calculated values are between about 545 V²m and 423 V²m for models with straight and blended pins respectively. Therefore, the full blending of inner conductor tip may help to lower dissipation E-field integral by 22% thus significantly reducing dielectric dissipations. FIG. 11 shows an example QWR resonator that has been milled into metal.

Prevailing surface oxide in niobium RF cavities is $Nb_2O_5$. RF measurements in thin $Nb_2O_5$ films confirm that a dielectric constant about 50 and loss tangent of 0.01 for temperatures lower than 100 K can be achieved in some embodiments. Also, loss tangent may remain substantially constant for frequencies larger than 1 MHz.

Typical thickness of dielectric films in niobium RF cavities may be around 50 Å (angstroms). This is remarkably smaller than cavity larger dimensions (e.g., on the order of millimeters). Instead, losses in a 1 µm layer can be simulated and divided by a factor of 200 to obtain losses in the realistic film. In thin layers E-field density may not change deeper into the layer. Inferred dielectric losses thus may depend linearly on the surface thickness h:

$$P_{loss} \propto \int\int\int \vec{E}\vec{D}dV_d = \int\int h\vec{E}\vec{D} \cdot dS_s,$$

$$P_{loss} \propto h.$$

Losses in a thick layer can be determined. Dividing them by a factor of 200 can be used to estimate Q-factor. An upper limit for the Q-factor may be introduced by dielectric losses.

A 50 Å thick $Nb_2O_5$ layer limits Q-factor of the improved geometry by $5.5 \cdot 10^8$. This is almost two times better than a dielectric Q-factor of $2.8 \cdot 10^8$ of unimproved geometry.

Machining fabrication methods can introduce limitations on the dimensions of the cavity. One of the most substantial restrictions is the cavity's length. From a manufacturing point of view, it may be more favorable to make the cavity relatively (e.g., as short as possible). A shorter cavity allows using a shorter cutter that improves cutter rigidity. Rigidity prevents the cutter from vibrating thus improves the quality of the machined surface.

In some embodiments, a port for vacuum pumping can be included. In some embodiments, the bottom cylindrical part can be made open to the outside vacuum volume of the dilution refrigerator. This may cause the cavity to be long enough so that RF fields do not reach the opening.

Reducing seam conductivity losses may be desirable. The surface magnetic field in the region of weld can induce currents flowing across the seam. Lower seam conductivity may introduce additional losses; therefore, an effort to reduce or minimize H-field on the seam can be desirable.

In some embodiments, clamping instead of welding may be used to create the cavity between two or more housing portions. The absence of welding may provide an advantage by allowing the use of aluminum instead of copper. Under dilution fridge temperature of 10 mK aluminum becomes superconducting which could introduce less conductivity losses.

RF parameters comparison of designs (FIGS. 9(*c*)-(*d*)) is presented in Table 3. RF parameters comparison of designs elaborated during the improvements ((c)-(d)) to the reference designs ((a)-(b)). Compared to the reference designs, the improved designs included an increase in the G-factor by 65%.

TABLE 3

RF parameters comparison of designs shown in FIGS. 9(a)-(e)

| Design | a | b | c | d | e |
|---|---|---|---|---|---|
| R/Q, Ω | 46.8 | 54 | 77 | 55 | 55 |
| G-factor, Ω | 44 | 57 | 62 | 71 | 71 |
| H-field on seam, A/m | 4800 | 16800 | 440 | 14300 | 7 |

Example Implementations

Various implementations described above are represented below by way of example.

In a 1st example, a resonator for use in quantum computing comprises: a housing disposed along a resonator axis, the housing having a first portion extending from a housing distal end to near a qubit location and a second portion extending from near the qubit location to a housing proximal end, the housing defining a cavity extending from a cavity proximal end to a cavity distal end along a portion of the resonator axis, wherein the housing comprises a protrusion extending axially from the housing distal end along the resonator axis to near the qubit location, a proximal portion of the protrusion comprising a tapered portion; and a qubit extending into the cavity at the qubit location.

In a 2nd example, the resonator of example 1, wherein an inner diameter of the cavity at the cavity distal end is greater than an inner diameter of the cavity at the cavity proximal end, each inner diameter measured from opposing sidewalls of the housing.

In a 3rd example, the resonator of any of examples 1-2, wherein at least a portion of the first portion of the housing comprises niobium.

In a 4th example, the resonator of any of examples 1-3, wherein at least a portion of the second portion of the housing comprises aluminum, copper, or both.

In a 5th example, the resonator of any of examples 1-4, comprising a Josephson junction disposed on or near the qubit.

In a 6th example, the resonator of example 5, wherein the qubit comprises a transmon.

In a 7th example, the resonator of any of examples 1-6, wherein the resonator is configured to operate at a temperature of less than 2 K.

In an 8th example, the resonator of any of examples 1-7, further comprising superconducting electronic circuitry in electrical communication with the resonator.

In a 9th example, the resonator of any of examples 1-8, wherein the protrusion comprises an axially tapering diameter at the proximal portion.

In a 10th example, the resonator of any of examples 1-9, wherein the first portion of the housing comprises a tapered portion.

In a 11th example, the resonator of any of examples 1-10, wherein a shape of the protrusion is generally cylindrical.

In a 12th example, the resonator of any of examples 1-11, wherein a distance between the protrusion and a housing sidewall within the cavity is at a minimum at the proximal portion of the protrusion.

In a 13th example, the resonator of any of examples 1-12, wherein a shape of a proximal portion of the cavity is generally cylindrical.

In a 14th example, the resonator of any of examples 1-13, wherein the housing comprises an aperture configured to allow evacuation of the cavity therethrough.

In a 15th example, the resonator of example 14, wherein the aperture is disposed within the proximal portion of the housing.

In a 16th example, the resonator of any of examples 1-15, wherein the resonator is configured to provide a quality factor (Q) of at least about $1.0 \times 10^7$.

In a 17th example, the resonator of any of examples 1-16, wherein the proximal portion of the protrusion has a maximum radius of less than 5 mm.

In a 18th example, the resonator of any of examples 1-17, wherein a transition between a sidewall of the housing and the housing distal end forms a sidewall blend radius of between about 0.01 mm and 50 mm.

In a 19th example, the resonator of any of examples 1-18, wherein a transition between the housing distal end and a base of the protrusion forms a base blend radius of between about 0.01 mm and 50 mm.

In a 20th example, the resonator of any of examples 1-19, wherein the tapered portion of the protrusion comprises a rounded tip having a rounding radius of between about 0.01 mm and 50 mm.

In a 21st example, the resonator of any of examples 1-20, further comprising a seam between the first and second portions of the housing.

In a 22nd example, the resonator of any of examples 1-21, further comprising a second qubit within the resonator, the second qubit being in electrical communication with the qubit.

In a 23rd example, the resonator of any of examples 1-22, further comprising a second protrusion extending axially from the housing proximal end along the resonator axis.

In a 24th example, the resonator of example 23, wherein a distal portion of the second protrusion comprises a tapered portion.

In a 25th example, the resonator of any of examples 1-24, wherein the housing forms an axial gap disposed radially outward of a main chamber of the housing.

In a 26th example, the resonator of example 25, wherein a width of the axial gap is between about 0.05 mm and 20 mm.

In a 27th example, the resonator of any of examples 1-26, wherein the resonator contains a frequency of between about 1 GHz and 24 GHz.

In a 28th example, a method of manufacturing a quantum computing resonator comprises: forming a cavity generally along a longitudinal axis within a housing extending axially from a cavity proximal end to a cavity distal end, the housing having a proximal portion and a distal portion; forming a protrusion within the housing, the protrusion extending axially from the distal portion of the housing through a portion of the cavity, a proximal portion of the protrusion having a tapered diameter; and disposing a qubit within the resonator.

In a 29th example, the method of example 28, wherein disposing the qubit within the resonator comprises disposing the qubit near the proximal portion of the protrusion.

In a 30th example, the method of any of examples 28-29, wherein forming the protrusion within the housing comprises forming an inner diameter of the distal end of the cavity to be greater than an inner diameter of the proximal end of the cavity, wherein each inner diameter measured from opposing sidewalls of the housing.

In a 31st example, the method of any of examples 28-30, wherein forming the protrusion within the housing comprises forming at least a portion of the distal portion of the housing using niobium, aluminum or another superconducting materials having a superconducting critical temperature above 100 mK.

In a 32nd example, the method of any of examples 28-31, wherein forming the protrusion within the housing comprises forming at least a portion of the proximal portion of the housing using niobium, aluminum, copper, or both.

In a 33rd example, the method of any of examples 28-32, further comprising reducing a temperature of the housing to less than 2 K.

In a 34th example, the method of any of examples 28-33, further comprising evacuating the cavity.

In a 35th example, the method of any of examples 28-34, wherein forming the cavity generally along the longitudinal axis within the housing comprises: forming the proximal portion of the housing; forming the distal portion of the housing; and bonding the proximal and distal portions of the housing together generally along the longitudinal axis.

In a 36th example, the method of example 35, wherein disposing the qubit within the resonator comprises disposing a conductor between the proximal and distal portions of the housing, the conductor being in electrical communication with the qubit.

In a 37th example, the method of any of examples 28-36, further comprising disposing a second qubit within the resonator.

In a 38th example, the method of any of examples 28-37, further comprising forming a second protrusion within the housing, the protrusion extending axially from the proximal portion of the housing.

In a 39th example, the method of example 38, wherein forming the second protrusion comprises tapering a distal portion of the second protrusion.

In a 40th example, the method of any of examples 28-39, further comprising forming a gap within the housing radially outward of a main chamber of the housing.

In a 41st example, a resonator for use in quantum computing comprises: a housing disposed along a resonator axis, the housing having a first portion extending from a housing distal end to near a qubit location and a second portion extending from near the qubit location to a housing proximal end, the housing defining a cavity extending from a cavity proximal end to a cavity distal end along a portion of the resonator axis, wherein the housing comprises a distal protrusion extending axially from the housing distal end along the resonator axis and a proximal protrusion extending axially from the housing proximal end along the resonator axis; and a qubit extending into the cavity at the qubit location.

In a 42nd example, the resonator of example 41, wherein at least a portion of the first portion of the housing comprises niobium.

In a 43rd example, the resonator of any of examples 41-42, wherein at least a portion of the second portion of the housing comprises aluminum, copper, or both.

In a 44th example, the resonator of any of examples 41-43, comprising a Josephson junction disposed on or near the qubit.

In a 45th example, the resonator of example 44, wherein the qubit comprises a transmon.

In a 46th example, the resonator of any of examples 41-45, wherein the resonator is configured to operate at a temperature of less than 2 K.

In a 47th example, the resonator of any of examples 41-46, further comprising superconducting electronic circuitry in electrical communication with the resonator.

In a 48th example, the resonator of any of examples 41-47, wherein the distal protrusion comprises an axially tapering diameter at the proximal portion of the distal protrusion.

In a 49th example, the resonator of any of examples 41-48, wherein the first portion of the housing comprises a tapered portion.

In a 50th example, the resonator of any of examples 41-49, wherein a shape of the distal protrusion is generally cylindrical.

In a 51st example, the resonator of any of examples 41-50, wherein a distance between the distal protrusion and a housing sidewall within the cavity is at a minimum at the proximal portion of the distal protrusion.

In a 52nd example, the resonator of any of examples 41-51, wherein a shape of a proximal portion of the cavity is generally cylindrical.

In a 53rd example, the resonator of any of examples 41-52, wherein the housing comprises an aperture configured to allow evacuation of the cavity therethrough.

In a 54th example, the resonator of any of examples 41-53, wherein the resonator is configured to provide a quality factor (Q) of at least about $1.0 \times 10^7$.

In a 55th example, the resonator of any of examples 41-54, wherein the proximal portion of the distal protrusion has a maximum radius of less than 5 mm.

In a 56th example, the resonator of any of examples 41-55, wherein a transition between a sidewall of the housing and the housing distal end forms a sidewall blend radius of between about 0.01 mm and 50 mm.

In a 57th example, the resonator of any of examples 41-56, wherein a transition between the housing distal end and a base of the distal protrusion forms a base blend radius of between about 0.01 mm and 50 mm.

In a 58th example, the resonator of any of examples 41-57, wherein the tapered portion of the distal protrusion comprises a rounded tip having a rounding radius of between about 0.01 mm and 50 mm.

In a 59th example, the resonator of any of examples 41-58, further comprising a seam between the first and second portions of the housing.

In a 60th example, the resonator of any of examples 41-59, further comprising a second qubit within the resonator, the second qubit being in electrical communication with the qubit.

In a 61st example, the resonator of any of examples 41-60, wherein a distal portion of the proximal protrusion comprises a tapered portion.

In a 62nd example, the resonator of any of examples 41-61, wherein the housing forms an axial gap disposed radially outward of a main chamber of the housing.

In a 63rd example, the resonator of example 62, wherein a width of the axial gap is between about 0.05 mm and 20 mm.

In a 64th example, the resonator of any of examples 41-63, wherein the resonator contains a frequency of between about 1 GHz and 24 GHz.

Other Considerations

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

It should be emphasized that many variations and modifications may be made to the above-described embodiments. All modifications and variations are intended to be included herein within the scope of the disclosure. The foregoing description details certain embodiments of the invention. It will be appreciated, however, that no matter how detailed the foregoing appears in text, the invention can be practiced in many ways. The use of particular terminology when describing certain features or aspects of the invention does not imply that the terminology is being re-defined herein to be restricted to including any specific characteristics of the features or aspects of the invention with which that terminology is associated. The scope of the invention should therefore be construed in accordance with the appended embodiments and/or claims and any equivalents thereof.

What is claimed is:

1. A resonator for use in quantum computing, the resonator comprising:
   a housing disposed along a resonator axis, the housing having a first portion extending from a housing distal end to near a qubit location and a second portion extending from near the qubit location to a housing proximal end,
   the housing defining a cavity extending from a cavity proximal end to a cavity distal end along a portion of the resonator axis,
   wherein the housing comprises a protrusion extending axially from the housing distal end along the resonator axis to near the qubit location, a proximal portion of the protrusion comprising a tapered portion; and
   a qubit extending into the cavity at the qubit location.

2. The resonator of claim 1, wherein an inner diameter of the cavity at the cavity distal end is greater than an inner diameter of the cavity at the cavity proximal end, each inner diameter measured from opposing sidewalls of the housing.

3. The resonator of claim 1, wherein at least a portion of the first portion of the housing comprises niobium.

4. The resonator of claim 1, wherein at least a portion of the second portion of the housing comprises aluminum, copper, or both.

5. The resonator of claim 1, comprising a Josephson junction disposed on or near the qubit.

6. The resonator of claim 5, wherein the qubit comprises a transmon.

7. The resonator of claim 1, wherein the protrusion comprises an axially tapering diameter at the proximal portion.

8. The resonator of claim 1, wherein the first portion of the housing comprises a tapered portion.

9. The resonator of claim 1, wherein a shape of the protrusion is generally cylindrical.

10. The resonator of claim 1, wherein a distance between the protrusion and a housing sidewall within the cavity is at a minimum at the proximal portion of the protrusion.

11. The resonator of claim 1, wherein a shape of a proximal portion of the cavity is generally cylindrical.

12. The resonator of claim 1, wherein the housing comprises an aperture configured to allow evacuation of the cavity therethrough.

13. The resonator of claim 1, further comprising a seam between the first and second portions of the housing.

14. The resonator of claim 13, wherein the aperture is disposed within the proximal portion of the housing.

15. The resonator of claim 1, further comprising a second qubit within the resonator, the second qubit being in electrical communication with the qubit.

16. The resonator of claim 1, further comprising a second protrusion extending axially from the housing proximal end along the resonator axis.

17. The resonator of claim 1, wherein the housing forms an axial gap disposed radially outward of a main chamber of the housing.

18. A method of manufacturing a quantum computing resonator, the method comprising:
   forming a cavity generally along a longitudinal axis within a housing extending axially from a cavity proximal end to a cavity distal end, the housing having a proximal portion and a distal portion;
   forming a protrusion within the housing, the protrusion extending axially from the distal portion of the housing through a portion of the cavity, a proximal portion of the protrusion having a tapered diameter; and
   disposing a qubit within the resonator.

19. The method of claim 18, wherein disposing the qubit within the resonator comprises disposing the qubit near the proximal portion of the protrusion.

20. The method of claim 18, wherein forming the cavity generally along the longitudinal axis within the housing comprises:
   forming the proximal portion of the housing;
   forming the distal portion of the housing; and
   bonding the proximal and distal portions of the housing together generally along the longitudinal axis.

* * * * *